United States Patent
Shin et al.

(10) Patent No.: US 9,246,126 B2
(45) Date of Patent: Jan. 26, 2016

(54) ORGANIC LIGHT EMITTING DIODE DISPLAY

(75) Inventors: Sang-wook Shin, Yongin (KR); Taek-Gyun Chung, Yongin (KR); Ji-Mi Yoon, Yongin (KR); Ung-Soo Lee, Yongin (KR); Tae-Min Kim, Yongin (KR); Dae-Ho Lim, Yongin (KR)

(73) Assignee: Samsung Display Co., Ltd. (KR)

( * ) Notice: Subject to any disclaimer, the term of this patent is extended or adjusted under 35 U.S.C. 154(b) by 915 days.

(21) Appl. No.: 12/615,984

(22) Filed: Nov. 10, 2009

(65) Prior Publication Data

US 2010/0117067 A1    May 13, 2010

(30) Foreign Application Priority Data

Nov. 11, 2008  (KR) .................. 10-2008-0111779

(51) Int. Cl.
  *H01L 33/00*  (2010.01)
  *H01L 51/52*  (2006.01)
(52) U.S. Cl.
  CPC ....... *H01L 51/5246* (2013.01); *H01L 2251/566* (2013.01)
(58) Field of Classification Search
  CPC .............. H01L 51/5246; H01L 51/525; H01L 51/5237; H01L 2251/566
  See application file for complete search history.

(56) References Cited

U.S. PATENT DOCUMENTS

| | | | |
|---|---|---|---|
| 2003/0062518 A1* | 4/2003 | Auch et al. | 257/40 |
| 2004/0207314 A1 | 10/2004 | Aitken et al. | |
| 2006/0065960 A1 | 3/2006 | Maruyama et al. | |
| 2007/0176185 A1 | 8/2007 | Lee et al. | |
| 2007/0205719 A1 | 9/2007 | Kim | |
| 2010/0258346 A1* | 10/2010 | Chen et al. | 174/521 |

FOREIGN PATENT DOCUMENTS

| | | |
|---|---|---|
| CN | 1819728 | 8/2006 |
| EP | 1 662 590 | 5/2006 |
| JP | 10-074583 | 3/1998 |
| JP | 2001-022293 | 1/2001 |
| JP | 2002-124374 | 4/2002 |
| JP | 2002-280169 | 9/2002 |
| JP | 2002-289169 | 10/2002 |
| JP | 2002-329576 | 11/2002 |
| JP | 2004-511367 | 4/2004 |
| JP | 2005 050773 | 2/2005 |
| JP | 2005-510831 | 4/2005 |
| JP | 2006-054146 | 2/2006 |

(Continued)

OTHER PUBLICATIONS

European Search Report dated Mar. 22, 2010, for corresponding European Application No. 09175645.2.

(Continued)

*Primary Examiner* — Laura Menz
*Assistant Examiner* — Candice Y Chan
(74) *Attorney, Agent, or Firm* — Knobbe Martens Olson & Bear LLP

(57) ABSTRACT

An OLED display is disclosed. The display includes a rear substrate, a front substrate facing the rear substrate, a cell seal provided between the rear and front substrates to adhere the two substrates to each other, and a reinforcement member provided between the rear and front substrates adjacent to the cell seal to adhere the two substrates to each other.

14 Claims, 8 Drawing Sheets

(56) References Cited

FOREIGN PATENT DOCUMENTS

| | | |
|---|---|---|
| JP | 2006-156361 | 6/2006 |
| JP | 2007-194184 | 8/2007 |
| JP | 2008-066266 | 3/2008 |
| KR | 10-2006-0059087 | 6/2006 |
| KR | 10-0673765 B1 | 1/2007 |
| KR | 10 0688795 | 2/2007 |
| KR | 10 0703519 B1 | 3/2007 |
| KR | 10 2007 0077010 A | 7/2007 |

OTHER PUBLICATIONS

Notice of Allowance dated May 31, 2010 in priority application KR10-2008-0111779.

* cited by examiner

ORGANIC LIGHT EMITTING DIODE DISPLAY

CROSS-REFERENCE TO RELATED APPLICATION

This application claims priority to and the benefit of Korean Patent Application No. 10-2008-0111779 filed in the Korean Intellectual Property Office on Nov. 11, 2008, the entire contents of which are incorporated herein by reference.

BACKGROUND

1. Field

The field relates to an organic light emitting diode (OLED) display. More particularly, the field relates to an OLED display that reinforces adhesive force of a cell seal adhering adjacent substrates.

2. Description of the Related Technology

An OLED display includes a plurality of OLEDs each of which includes a hole injection electrode, an organic emission layer, and an electron injection electrode, and light is emitted by energy that is generated when an exciton that is generated by recombination of electrons and holes falling from an excited state to a ground state within the organic emission layer.

The OLED display has sub-pixels in a matrix format in a display area, and the sub-pixels each include an OLED and a driving circuit unit. The driving circuit unit includes a switching transistor, a driving transistor, and a storage capacitor.

The OLED display may be individually manufactured, or a plurality of OLED displays may be manufactured for productivity improvement. A base substrate (or, an array substrate, hereinafter referred to as a base substrate) has a plurality of unit cells between front and rear substrates. Herein, one OLED display is a unit cell, and hereinafter will be referred to as such.

A cell seal is provided between front substrate and the rear substrate to adhere the two substrates. As one example, the cell seal may be formed of a glass frit. The glass frit is applied to a top light emitting type of OLED display that realizes high resolution, and effectively prevents transmission of external moisture or oxygen into the unit cell.

Although a cell seal formed of the glass fit can block external moisture or oxygen extremely well, it also generates thermal shock or stress due to mismatch in thermal conformity with the main glass (i.e., a front substrate or a rear substrate). Accordingly, mechanical strength of the base substrate or the OLED display is weakened.

The above information disclosed in this Background section is only for enhancement of understanding of the background of the invention and therefore it may contain information that does not form the prior art that is already known in this country to a person of ordinary skill in the art.

SUMMARY OF CERTAIN INVENTIVE ASPECTS

One aspect is an organic light emitting diode (OLED) display, including a rear substrate including an OLED and a driving circuit unit, a front substrate facing the rear substrate, a cell seal provided between the rear substrate and the front substrate and adhering the rear substrate and the front substrate to each other, and a reinforcement member provided between the rear substrate and the front substrate adjacent to the cell seal and adhering the rear substrate and the front substrate to each other.

Another aspect is an array of displays, the array including front and rear substrates, adjacent cell seals formed at peripheral portions of adjacent displays, the cell seals formed between the front and rear substrates, where the cell seals adhere the rear substrate and the front substrate to each other, and where the cell seals are spaced apart from one another, forming a cavity defined by the cell seals, the front substrate and the rear substrate, and a reinforcement member formed in the cavity, where the reinforcement member adheres the rear substrate and the front substrate to each other.

DETAILED DESCRIPTION OF CERTAIN INVENTIVE EMBODIMENTS

Figure 1:
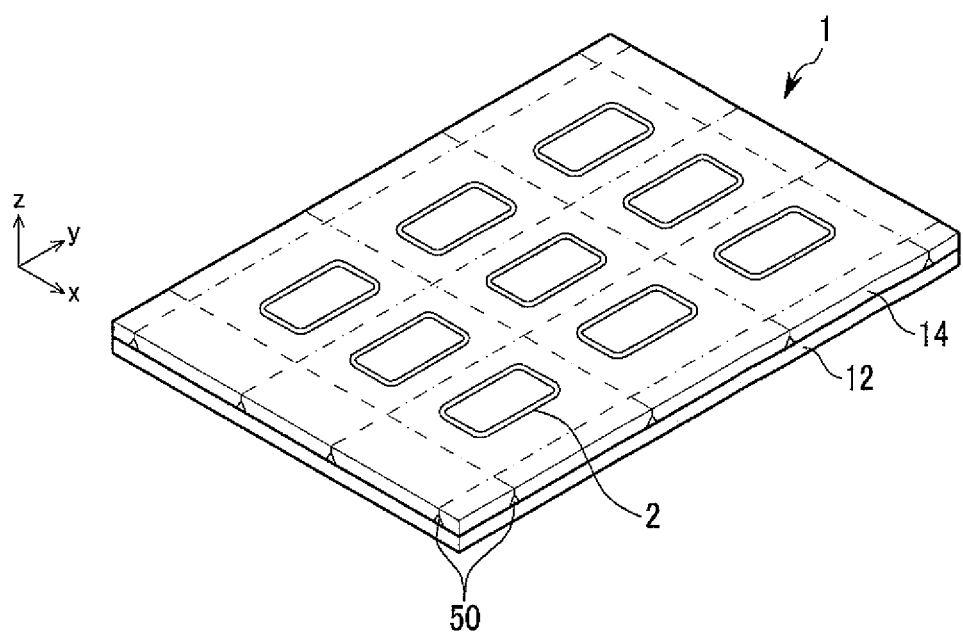
FIG. 1 is a perspective view of a base substrate including a plurality of unit cells each of which is an OLED display.

An exemplary embodiment relates to an OLED display that includes a reinforcement member that reinforces adhesive force of a cell seal.

An exemplary embodiment relates to an OLED display that eases insertion of a reinforcement member at one side of a cell seal.

An OLED display according to an exemplary embodiment may include a rear substrate including an OLED and a driving circuit unit, a front substrate facing the rear substrate, a cell seal provided between the rear substrate and the front substrate and adhering the rear substrate and the front substrate to each other, and a reinforcement member provided between the rear substrate and the front substrate at one side of the cell seal and adhering the rear substrate and the front substrate to each other.

The front substrate may include a first inducing portion that induces flow of the reinforcement member to one side of the cell seal.

The first inducing portion may be formed in at least one side surface among four side surfaces of the front substrate formed as a square plate.

The first inducing portion may include a half-triangular space formed by cutting a triangular space formed between a sloped surface and the rear substrate by connecting an inner surface and a side surface of the front substrate with the sloped surface.

The first inducing portion may include a half-square space formed by cutting a square space formed between a rectangular surface and the rear substrate by connecting an inner surface and a side surface of the front substrate with the rectangular surface.

The first inducing portion may include a half-semicircle space formed by cutting a semicircle space formed between an arc surface and the rear substrate by connecting an inner surface and a side surface of the front substrate with the arc surface.

The first inducing portion may include a half-semi-ellipse space formed by cutting a semi-ellipse space formed between an arc surface and the rear substrate by connecting an inner surface and a side surface of the front substrate with the arc surface.

The reinforcement member may include a reinforcing portion filled in a space of the first inducing portion of the front substrate, and a reinforcing portion filled in a space set by a surface of the OLED, an inner surface of the front substrate, and one side of the cell seal and that is connected to one of the reinforcing portion.

The cell seal may be formed of a glass fit, and the reinforcement member may be formed of a resin.

The rear substrate may have a second inducing portion that induces flow of the reinforcement member toward one side of the cell seal.

The second inducing portion may include a first inducing portion formed in the rear substrate, and a plurality of second inducing portions that are sequentially stacked on the driving circuit unit stacked on the first inducing portion and a layer of the OLED.

The reinforcement member may include a first reinforcing portion filled in the second inducing portion of the OLED, and a second reinforcing portion filled in a space set by a surface of the OLED, an inner surface of the front substrate, and one side of the cell seal and that is connected to the first reinforcing portion.

According to an exemplary embodiment, adhesive force between the two substrates can be further reinforced by providing the reinforcement member between the two substrates at one side of the cell seal.

According to an exemplary embodiment, insertion of the reinforcement member at one side of the cell seal can be eased by providing an inducing portion at one side of the front and rear substrates to induce insertion of the reinforcement member.

According to an exemplary embodiment, thermal shock or stress of the cell seal can be endured by adhering the two substrates with the reinforcement member inserted into one side of the cell seal so that reliability of mechanical strength can be improved.

Certain embodiments will be described more fully hereinafter with reference to the accompanying drawings, in which exemplary embodiments of the invention are shown. As those skilled in the art would realize, the described embodiments may be modified in various ways, without departing from the spirit or scope of the present invention. The drawings and description are to be regarded as illustrative in nature and not restrictive. Like reference numerals generally designate like elements throughout the specification.

FIG. 1 is a perspective view of a base substrate having a plurality of unit cells each of which has an OLED display. Referring to FIG. 1, a base substrate 1 includes a rear substrate 12 and a front substrate 14 that form a plurality of unit cells. That is, in the base substrate 1, the unit cells forms OLED displays 2.

Each unit cell or OLED display 2 in the base substrate 1 includes the rear substrate 12 and the front substrate 14 that face each other, and a plurality of sub-pixels are arranged in a matrix format in a display area between the two substrates 12 and 14.

The individual OLED displays 2 are formed by cutting the base substrate 1.

Figure 2:
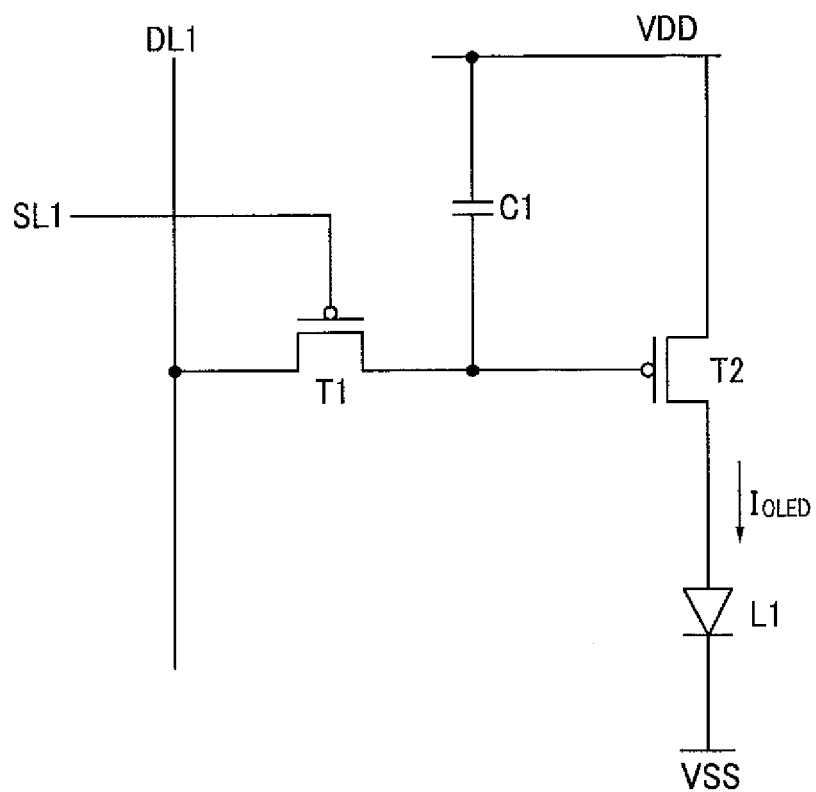
FIG. 2 is a schematic diagram of a structure of a sub-pixel of the OLED display of FIG. 1.
Figure 3:
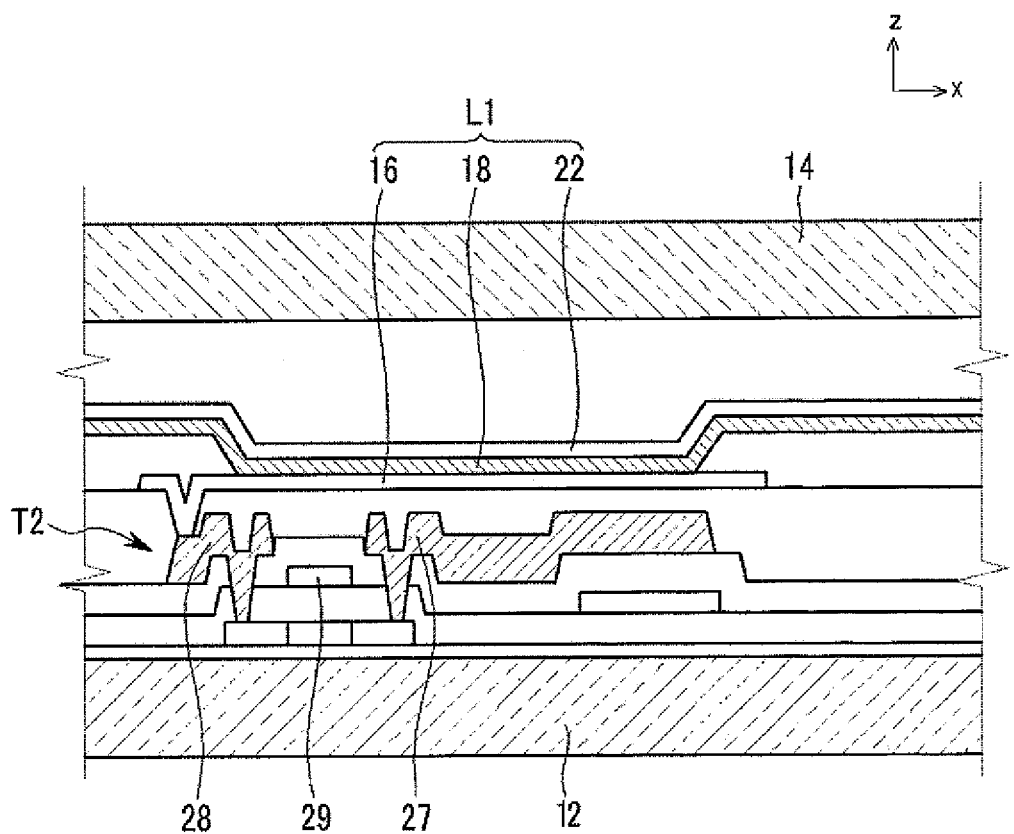
FIG. 3 is a cross-sectional view of the OLED display of FIG. 1.

FIG. 2 is a schematic diagram of an exemplary sub-pixel circuit structure of the OLED display of FIG. 1, and FIG. 3 is a cross-sectional view of the sub-pixel circuit and the OLED display of FIG. 1. Referring to FIG. 2 and FIG. 3, a sub-pixel in the OLED display 2 includes an OLED L1 and a driving circuit unit. Other sub-pixel circuit structures may also be used.

The OLED L1 includes an anode 16, an organic emission layer 18, and a cathode 22, and the driving circuit unit includes at least two thin film transistors and at least one storage capacitor CAP1. The thin film transistor basically includes a switching transistor T1 and a driving transistor T2.

The switching transistor T1 is connected to a scan line SL1 and a data line DL1, and transmits a data voltage input from the data line DL1 to the driving transistor T2 according to a switching voltage input to the scan line SL1.

The storage capacitor CAP1 is connected to the switching transistor T1 and a power source line VDD, and stores a voltage that corresponds to a voltage difference between a voltage from the switching transistor T1 and a voltage from the power source line VDD.

The driving transistor T2 is connected to the power source line VDD and the storage capacitor CAP1, and supplies an output current IOLED that is about proportional to the square of the difference between the voltage stored at the storage capacitor CAP1 and a threshold voltage of the OLED L1. The OLED L1 emits light according to the output current IOLED.

The driving transistor T2 includes a source electrode 27, a drain electrode 28, and a gate electrode 29, and the anode 16 of the OLED L1 may be connected to the drain electrode 28 of the driving transistor T2

The configuration of the sub-pixel is not limited thereto, and may be modified.

Figure 4:
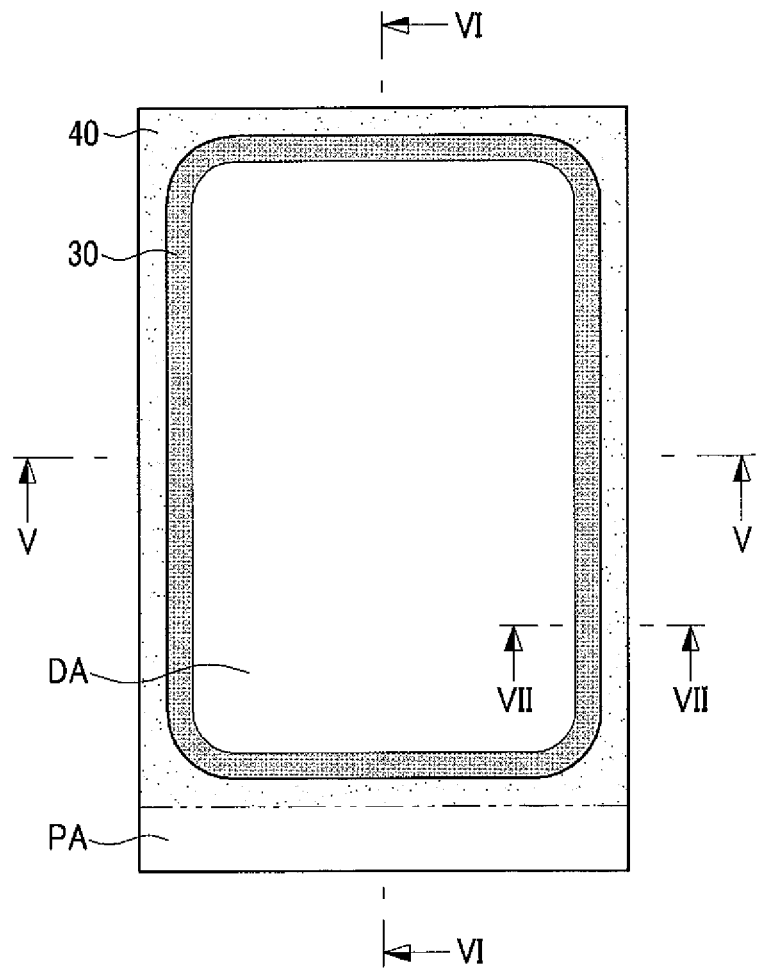
FIG. 4 is a top plan view of the OLED display cut from the base substrate of FIG. 1 for each unit cell.
Figure 5:
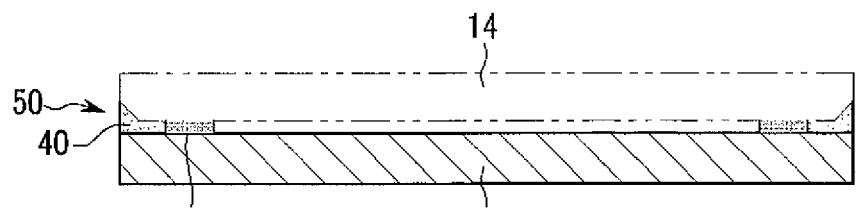
FIG. 5 is a cross-sectional view of FIG. 4, taken along the line V-V.

FIG. 4 is a top plan view of an OLED display that is cut out from the base substrate of FIG. 1. FIG. 5 is a cross-sectional view of FIG. 4 taken along the line V-V, and FIG. 6 is a cross-sectional view of FIG. 4 taken along the line VI-VI.

Figure 6:
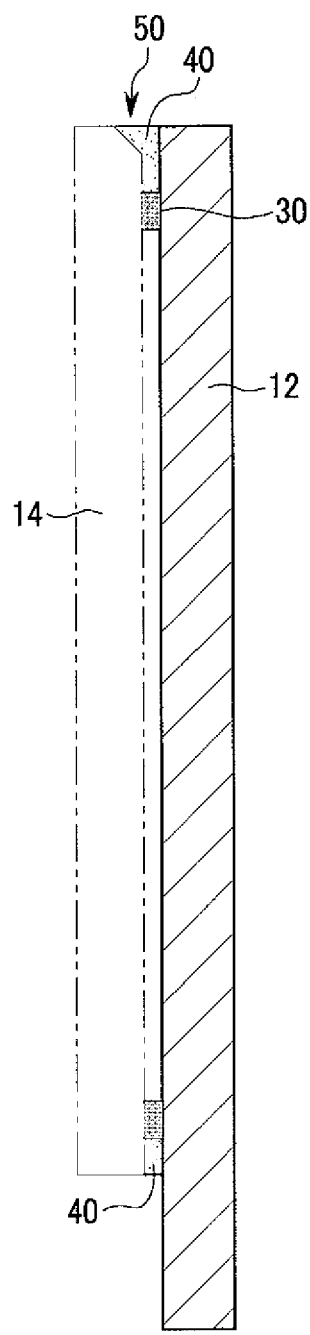
FIG. 6 is a cross-sectional view of FIG. 4, taken along the line VI-VI.

Referring to FIG. 4, FIG. 5, and FIG. 6, the OLED display 2 includes a cell seal 30 and a reinforcement member 40. The cell seal 30 is provided between the rear substrate 12 and the front substrate 14 to adhere the rear substrate 12 and the front substrate 14 to each other.

The cell seal 30 partitions the base substrate 1 to adhere front and rear substrates 14 and 12 of unit cells 2. For example, the cell seal 30 is formed of a glass frit and adheres the rear substrate 12 and the front substrate 14 to each other, and protects the OLEDs L1 and the driving circuit units in the unit cell from the external environment.

The reinforcement member 40 is provided at one side of the cell seal 30, for example between the rear substrate 12 and the front substrate 14 at an external side of the cell seal 30, to adhere the rear substrate 12 and the front substrate 14 to each other. Therefore, the rear substrate 12 and the front substrate 14 have a double-adhered structure by the cell seal 30 and the reinforcement member 40.

As an example, the reinforcement member 40 is formed of a resin and thus it reinforces the adhesive force of the cell seal 30 formed of the glass frit. Therefore, the reinforcement member 40 increases mechanical strength that is weakened by thermal shock or stress that is generated in accordance with mismatch in thermal expansion mismatch between the glass frit of the cell seal 30 and glass of the two substrates 12 and 14.

For improvement of adhesive force and reinforcement of mechanical strength, the reinforcement member 40 is inserted between the two substrates 12 and 14 with no gap between the reinforcement member 40 and either of the two substrates 12 and 14, at an external perimeter of the cell seal 30.

In order to effectively induce correct placement of the reinforcement member 40, at least one substrate of the two substrates 12 and 14 includes a groove 50 that induces flow of the reinforcement member 40. In some embodiments, the groove 50 induces flow of the reinforcement member 40 through capillary action. The groove may be selectively formed at one of the rear substrate 12 and the front substrate 14, or may be formed at both of the substrates 12 and 14.

The groove 50 will be referred to as a first inducing portion 50, and an inducing portion formed in the rear substrate 12 will be referred to as a second inducing portion 60. In one exemplary embodiment, the driving circuit unit and the OLED L1 are formed on the rear substrate 12, and therefore the first inducing portion 50 may be formed on the front substrate 14.

In the base substrate 1, the first inducing portion 50 may be formed in either or both of the y-axis and x-axis directions between the unit cells, and induces the reinforcement member 40 toward the front substrate 14 of each of the OLED displays 2.

In the unit cell or the OLED display 2, the first inducing portion 50 induces the flow of the reinforcement member 40 toward the cell seal 30 at an external side of the cell seal 30, for example toward a side surface 141 of the front substrate 14, to fill a space between the rear substrate 12 and the front substrate 12 with the reinforcement member 40.

Therefore, the first inducing portion 50 may be formed on at least one side surface among four side surfaces of the front substrate 14, and may be formed as a rectangular plate. In some exemplary embodiments, referring to FIG. 5 and FIG. 6, the first inducing portion 50 is formed at three side surfaces of a display area DA, excluding one side surface of the front substrate 14.

Figure 7:
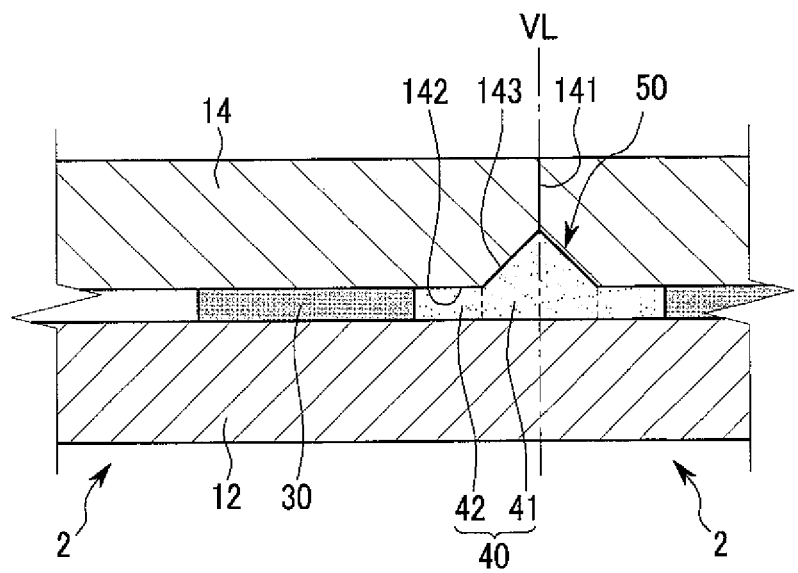
FIG. 7 is a cross-sectional view of FIG. 4, taken along the line VII-VII.

Referring to FIG. 7, the first inducing portion 50 includes a triangular space formed between a sloped surface 143 of the front substrate 14 and the rear substrate 12 between an inner surface 142 and the side surface 141 of the front substrate 14.

Therefore, the first inducing portion 50 includes a triangular space in the base substrate 1 where the front substrate 14 is etched in a cross-sectional triangle from an edge portion that corresponds to the cell seal 30. In addition, the first inducing portion 50 includes a half-triangular space formed by cutting the triangular space in half in the OLED display 2 of the unit cell.

The first inducing portion 50 is defined by the inner surface 142 of the front substrate 14, the sloped edge 143, the rear substrate 12, and perpendicular cross-sectional lines VL thereof at an edge of the unit cell. Referring to FIG. 3, the rear substrate 12 side provides a surface for the OLED L1. In some embodiments, the anode 22 provides one side of the first inducing portion 50.

For example, the etching depth of the front substrate 14, forming the triangular space of the first inducing portion 50, includes a range of 5 to 60 μm. When the etching depth exceeds 60 μm, the front substrate 14 may be easily damaged in the first inducing portion 50 of the base substrate 1, and when the etching depth is less than 5 μm, induction capability of the reinforcement member 40 in the first inducing portion 50 of the base substrate 1 may be insufficient.

The first inducing portion 50 and the sloped surface 143 of the front substrate 14 form a structure in which insertion of the reinforcement member 40 is induced, and the insertion amount of the reinforcement member 40 between the front substrate 14 and the rear substrate 12 is defined by the volume of the cavity created thereby.

The reinforcement member 40 includes a reinforcing portion 41 that is filled in a space that corresponds to the sloped surface 143 of the front substrate 14, and a reinforcing portion 42 that is filled in a space that corresponds to the inner surface 142 of the front substrate 14.

The reinforcing portion 41 may fill a space defined by the OLED L1 and the sloped surface 143 of the front substrate 14, and reinforces the adhesive function of the cell seal 30. The reinforcing portion 42 may fill a space defined by a surface of the OLED L1, the inner surface 142 of the front substrate 14, and one side of the cell seal 30, and is connected to the reinforcing portion 41 to reinforce the adhesive function of the cell seal 30.

Figure 8:
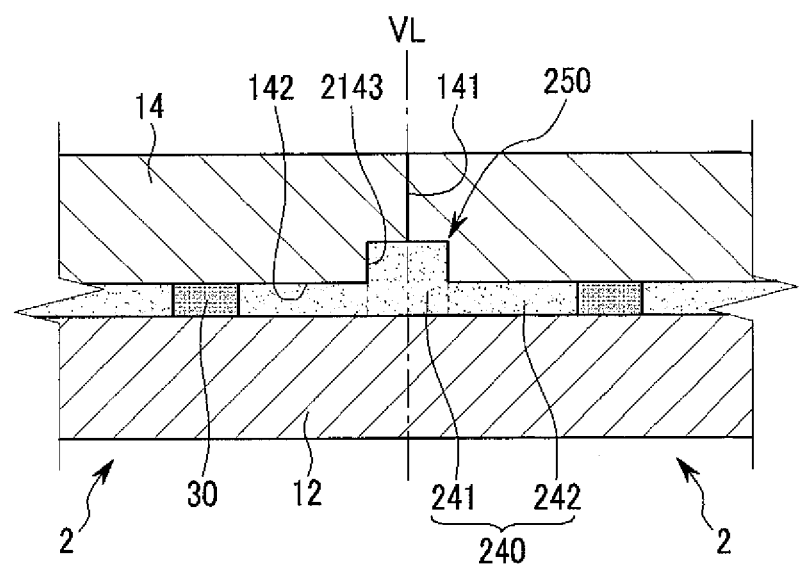
FIG. 8 is a cross-sectional view of an OLED display according to another exemplary embodiment.

FIG. 8 is a partial cross-sectional view of an OLED display according to another exemplary embodiment. Referring to FIG. 8, a first inducing portion 250 includes a rectangular space formed between the front and rear substrates 14 and 12, in an area defined by an inner surface 142, surface 2143 and a side surface 141 of the front substrate 14 and the rear substrate 12.

The inducing portion 250 includes a rectangular space in the base substrate 1 having the front substrate 14 that is in a cross-sectional rectangle from an edge portion of cell seal 30, and the inducing portion 250 includes a rectangular space defined by surface 2143.

A reinforcement member 240 includes a reinforcing portion 241 filled in a space that corresponds to the inducing portion 250, and a reinforcing portion 242 filled in a space that corresponds to the inner surface 142 of the front substrate 14.

The reinforcing portion 241 is filled in a space defined by the rear substrate 12 and the rectangular surface 2143 of the front substrate 14 to reinforce the adhesive function of the cell seal 30. The reinforcing portion 242 is filled in a space defined by a surface of the rear substrate 12, the inner surface 142 of the front substrate 14, and one side of the cell seal 30 and is connected to the reinforcing portion 241 to reinforce the adhesive function of the cell seal 30.

The first inducing portion 250 can further increase the insertion amount of the reinforcement member 240 by forming a larger space compared to the inducing portion 50 of FIG. 7.

Figure 9:
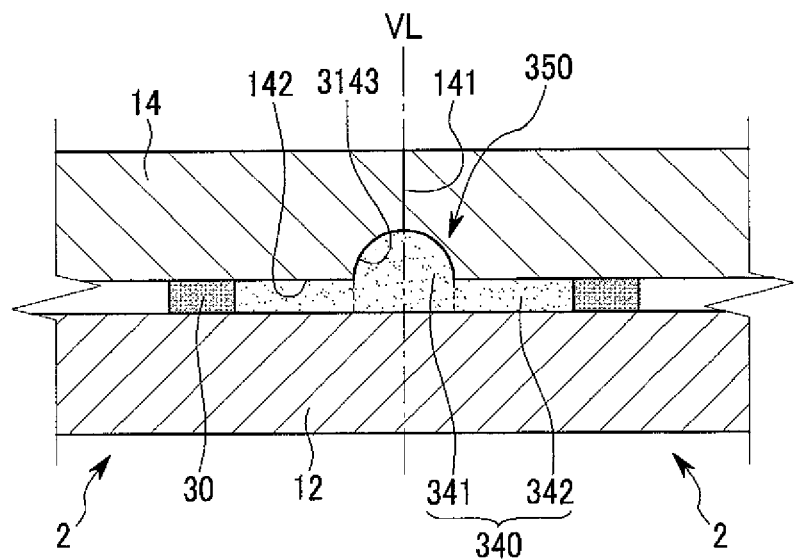
FIG. 9 is a cross-sectional view of an OLED display according to yet another exemplary embodiment.

FIG. 9 is a cross-sectional view of an OLED display according to another exemplary embodiment. Referring to FIG. 9, a first inducing portion 350 includes a space formed between an arc surface 3143 and a rear substrate 12, where the arc surface 3143 is between the inner surface 142 and the side surface 141 of the front substrate 14.

The first inducing portion 350 includes a semicircle space in the base substrate 1, where the front substrate 14 has a cross-sectional semicircle shape cavity at an edge portion near the cell seal 30.

Reinforcement member 340 includes a reinforcing portion 341 filled in a space that corresponds to the arc surface 3143 of the front substrate 14, and a reinforcing portion 342 filled in a space that corresponds to the inner surface 142 of the front substrate 14.

The reinforcing portion 341 is filled in a space defined by the rear substrate 12 and the arc surface 3143 of the front substrate 14, and reinforces the adhesive function of cell seal 30. The reinforcing portion 342 is filled in a space defined by the rear substrate 12, the inner surface 142 of the front substrate 14, and one side of the cell seal 30, and is connected to the reinforcing portion 341 to reinforce the adhesive function of the cell seal 30.

Figure 10:
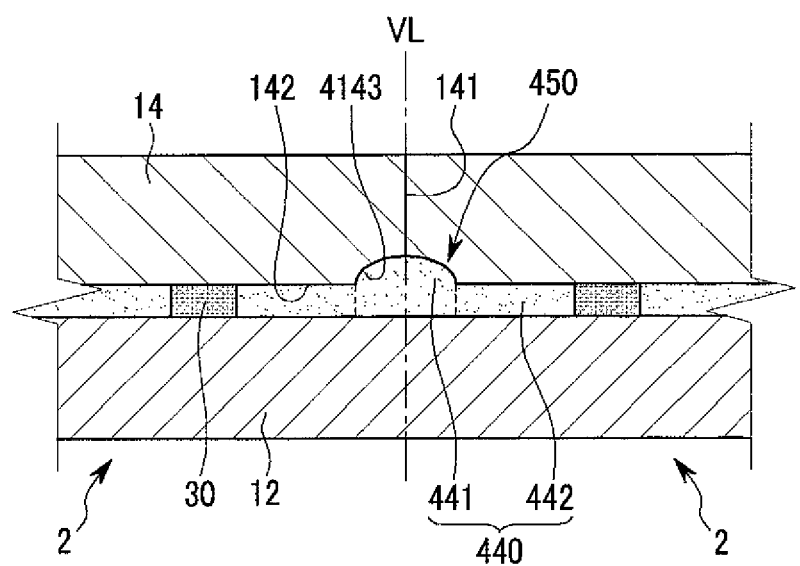
FIG. 10 is a cross-sectional view of an OLED display according to still another exemplary embodiment.

FIG. 10 is a cross-sectional view of an OLED display according to another exemplary embodiment. Referring to FIG. 10, a first inducing portion 450 includes a space formed between an arc surface 4143 and a rear substrate 12, where the arc surface 4143 is between the inner surface 142 and the side surface 141 of the front substrate 14.

The first inducing portion 450 includes a semi-ellipse space in the base substrate 1, where the front substrate 14 is etched in a cross-sectional semi-ellipse at an edge portion near the cell seal 30.

A reinforcement member 440 includes a reinforcing portion 441 in a space defined by the arc surface 4143 of the front substrate 14 and a reinforcing portion 442 in a space defined by the inner surface 142 of the front substrate 14.

The reinforcing portion 441 is filled in a space defined by the rear substrate 12 and the arc surface 4143 of the front substrate 14, and reinforces the adhesive function of a cell seal 30. The reinforcing portion 442 is filled in a space defined by a surface of the rear substrate 12, the inner surface 142 of the front substrate 14, and one side of the cell seal 30, and is connected to the reinforcing portion 441 to reinforce the adhesive function of the cell seal 30.

Figure 11:
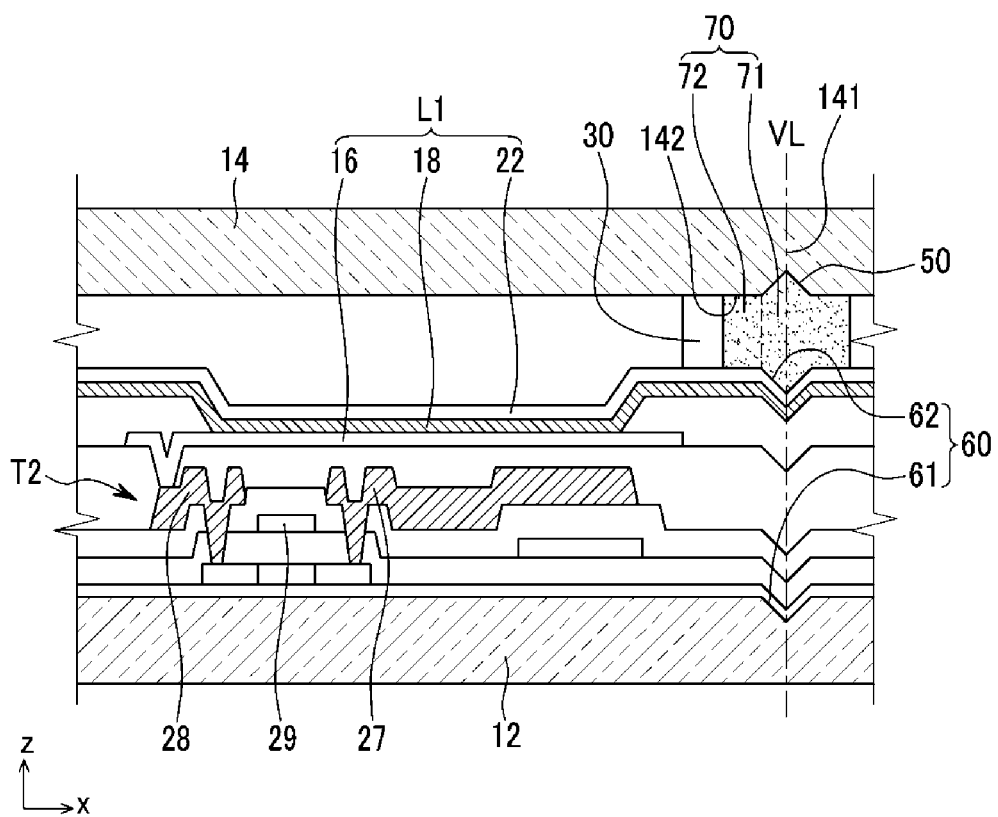
FIG. 11 is a cross-sectional view of an OLED display according to another exemplary embodiment.

FIG. 11 is a cross-sectional view of an OLED display according to another exemplary embodiment. Referring to FIG. 11, a second inducing portion 60 in the exemplary embodiment of FIG. 5 is formed to induce the flow of a reinforcement member 70 on one side of a cell seal 30.

The second inducing portion 60 includes an inducing portion 61 formed on the rear substrate 12 and a plurality of inducing portions 62 that are sequentially formed on rear substrate 12. In some embodiments, the inducing portion is limited to the layer immediately adjacent the reinforcement member 70. In some embodiments, one or more layers between the reinforcement member 70 and the rear substrate 12 have inducing portions. In some embodiments, the rear substrate does not have an inducing portion.

The reinforcement member 70 includes a reinforcing portion 71 in the second inducing portion 60, and a reinforcing portion 72 in a space that corresponds to an inner surface 142 of the front substrate 14.

The reinforcing portion 71 is filled in the space that corresponds to the inducing portions 62 and reinforces the adhesive function of a cell seal 30. The reinforcing portion 72 is in a space defined by a surface of the rear substrate 12, the inner surface 142 of the front substrate 14, and one side of the cell seal 30, and is connected to the reinforcing portion 71 to reinforce the adhesive function of the cell seal 30.

While this invention has been described in connection with what is presently considered to be practical exemplary embodiments, it is to be understood that the invention is not limited to the disclosed embodiments, but, on the contrary, is intended to cover various modifications and equivalent arrangements.

What is claimed is:

1. An organic light emitting diode (OLED) display, comprising:
   a rear substrate including an OLED and a driving circuit unit;
   a front substrate facing the rear substrate;
   a cell seal provided between the rear substrate and the front substrate and adhering the rear substrate and the front substrate to each other; and
   a reinforcement member provided between the rear substrate and the front substrate, the reinforcement member contacting the cell seal and adhering the rear substrate and the front substrate to each other, wherein the front substrate includes a first inducing portion configured to induce flow of the reinforcement member towards the cell seal and wherein the rear substrate includes a second inducing portion configured to induce flow of the reinforcement member towards the cell seal; and
   one or more additional inducing portions formed in one or more layers between the front and rear substrates.

2. The OLED display of claim 1, wherein the first inducing portion comprises a triangular space between a sloped surface of the front substrate and the rear substrate.

3. The OLED display of claim 1, wherein the first inducing portion comprises a substantially rectangular cavity.

4. The OLED display of claim 1, wherein the first inducing portion has a cross-sectional area defined by a portion of a circle.

5. The OLED display of claim 1, wherein the first inducing portion has a cross-sectional area defined by a portion of an ellipse.

6. The OLED display of claim 1, wherein the reinforcement member comprises:
   a reinforcing portion between two substantially parallel portions of the front and rear substrates; and
   a reinforcing portion in the first inducing portion.

7. The OLED display of claim 1, wherein the cell seal is formed of a glass frit, and the reinforcement member is formed of a resin.

8. The OLED display of claim 1, wherein the reinforcement member comprises:
   a reinforcing portion between two substantially parallel portions of the front and rear substrates; and
   a reinforcing portion between a groove in one of the front and rear substrates and the other of the front and rear substrates.

9. An array of displays, the array comprising:
   front and rear substrates;
   adjacent cell seals formed at peripheral portions of adjacent displays, the cell seals formed between the front and rear substrates, wherein the cell seals adhere the rear substrate and the front substrate to each other, and wherein the cell seals are spaced apart from one another, forming a cavity defined by the cell seals, the front substrate and the rear substrate; and
   a reinforcement member formed in the cavity, wherein the reinforcement member contacts the cell seals and adheres the rear substrate and the front substrate to each other, wherein the reinforcement member is formed in a groove in each of the front and rear substrates, and each groove is configured to induce flow of the reinforcement member towards the cell seal; and
   one or more inducing portions formed in one or more layers between the front and rear substrates.

10. The array of claim 9, wherein the cell seals are formed of a glass frit, and the reinforcement member is formed of a resin.

11. The array of claim 9, wherein each groove comprises a cross-sectional shape defined by a portion of a triangle.

12. The array of claim 9, wherein each groove comprises a cross-sectional shape defined by a portion of a rectangle.

13. The array of claim 9, wherein each groove comprises a cross-sectional shape defined by a portion of a circle.

14. The array of claim 9, wherein each groove comprises a cross-sectional shape defined by a portion of an ellipse.

\* \* \* \* \*